United States Patent [19]
Carroll et al.

[11] Patent Number: 6,097,607
[45] Date of Patent: Aug. 1, 2000

[54] FLEXIBLE COMPUTER SYSTEM

[75] Inventors: David W. Carroll, Northfield; Wendell L. Carroll, Minneapolis; James L. Carroll, Northfield, all of Minn.

[73] Assignee: ViA, Inc., Northfield, Minn.

[21] Appl. No.: 08/969,431

[22] Filed: Nov. 1, 1997

Related U.S. Application Data

[60] Provisional application No. 60/030,177, Nov. 1, 1996.

[51] Int. Cl.$^7$ ................................ H05K 1/18; H01R 9/07
[52] U.S. Cl. ...................... 361/752; 361/736; 361/749; 361/789; 439/77; 439/91; 174/254; 174/268
[58] Field of Search ..................... 361/749, 776, 361/788, 789, 728, 729, 736, 752; 439/67, 77, 76.1, 91, 493; 364/708.1; 174/254, 268

[56] References Cited

U.S. PATENT DOCUMENTS

| | | | |
|---|---|---|---|
| 2,156,504 | 5/1939 | Liss | 2/312 |
| 3,588,359 | 6/1971 | Cribb | 379/174 |
| 3,744,025 | 7/1973 | Bilgutay | 382/184 |
| 3,873,889 | 3/1975 | Leyba | 439/77 |
| 3,876,863 | 4/1975 | Boone | 235/385 |
| 3,956,740 | 5/1976 | Jones et al. | 360/4 |
| 4,087,864 | 5/1978 | LaBove et al. | 2/102 |
| 4,096,577 | 6/1978 | Ferber et al. | 364/712 |
| 4,104,728 | 8/1978 | Kasubuchi | 525/438 |
| 4,254,451 | 3/1981 | Cochran, Jr. | 362/103 |
| 4,364,112 | 12/1982 | Onodera et al. | 364/709.12 |
| 4,533,188 | 8/1985 | Miniet | 439/77 |
| 4,545,023 | 10/1985 | Mizzi | 364/709.13 |
| 4,607,156 | 8/1986 | Koppenaal et al. | 235/472 |
| 4,633,881 | 1/1987 | Moore et al. | 600/436 |
| 4,690,653 | 9/1987 | Goldberg | 446/27 |
| 4,692,840 | 9/1987 | Ellis | 361/729 |
| 4,719,462 | 1/1988 | Hawkins | 342/20 |
| 4,756,940 | 7/1988 | Payne et al. | 428/78 |
| 4,768,971 | 9/1988 | Simpson | 439/329 |
| 4,781,601 | 11/1988 | Kuhl et al. | 439/77 |

(List continued on next page.)

FOREIGN PATENT DOCUMENTS

| | | |
|---|---|---|
| 0 251 643 A2 | 1/1988 | European Pat. Off. . |
| 0 264 956 A2 | 4/1988 | European Pat. Off. . |
| 0 531 645 A3 | 3/1993 | European Pat. Off. . |
| 56-74765 | 6/1981 | Japan . |
| 60-204056 | 10/1985 | Japan . |
| 2-177395 | 7/1990 | Japan . |
| 2-108164 U | 8/1990 | Japan . |
| 6-302930 | 10/1994 | Japan . |
| 1387091 | 3/1975 | United Kingdom . |
| WO 88/07659 | 10/1988 | WIPO . |
| WO 93/23801 | 11/1993 | WIPO . |
| WO 96/07143 | 3/1996 | WIPO . |
| WO 96/07921 | 3/1996 | WIPO . |
| WO 96/07924 | 3/1996 | WIPO . |

OTHER PUBLICATIONS

Known–Good Die: A Key to Cost–Effective MCMs, Electronic Packaging & Production, Sep. 1992, p. 50.

"Wearable Interconnection for Portable Computers"; IBM Technical Disclosure Bulletin; vol. 34, No. 10B, Mar. 1992, p. 30.

Helm, Leslie; Japan Turns Fanciful in the Evolution of Computers; Los Angeles Times; Oct. 14, 1991; Business Section; p. 1, Part D. col. 2.

"Die Hände werden frei"; nachrichten Elektronik und Telematrik; vol. 44, No. 4, Apr. 1990, Heidelberg DE, p. 154.

*Primary Examiner*—Donald Sparks
*Assistant Examiner*—John B. Vigushin
*Attorney, Agent, or Firm*—Patterson & Keough, P.A.

[57] ABSTRACT

A computing device unit includes an upper casing, at least one integrated chip module electrically mounted on an interior side of the upper casing, a lower casing selectively engageable with the upper casing, and a flexible circuitry ribbon extending through the upper casing and the lower casing, and being electrically connected to the at least one chip module within the lower and upper casing. Related devices and methods provide similar advantages.

28 Claims, 7 Drawing Sheets

U.S. PATENT DOCUMENTS

| | | | |
|---|---|---|---|
| 4,825,471 | 5/1989 | Jennings | 2/94 |
| 4,827,534 | 5/1989 | Haugen | 2/108 |
| 4,845,650 | 7/1989 | Meade et al. | 361/680 |
| 4,858,071 | 8/1989 | Manabe et al. | 361/749 |
| 4,882,685 | 11/1989 | vander Lely | 364/709.11 |
| 4,885,430 | 12/1989 | Kinser, Jr. et al. | 361/776 |
| 4,899,039 | 2/1990 | Taylor et al. | 250/208.2 |
| 4,916,441 | 4/1990 | Gombrich | 345/169 |
| 4,932,873 | 6/1990 | La Shier | 439/77 |
| 4,949,224 | 8/1990 | Yamamura et al. | 361/784 |
| 4,958,260 | 9/1990 | Kobayashi et al. | 361/749 |
| 5,003,300 | 3/1991 | Wells | 345/8 |
| 5,007,427 | 4/1991 | Suzuki et al. | 600/436 |
| 5,024,360 | 6/1991 | Rodriguez | 2/102 |
| 5,029,260 | 7/1991 | Rollason | 235/145 R |
| 5,035,242 | 7/1991 | Franklin et al. | 607/108 |
| 5,051,366 | 9/1991 | Anderson et al. | 439/73 |
| 5,067,907 | 11/1991 | Shotey | 439/135 |
| 5,078,134 | 1/1992 | Heilman et al. | 607/4 |
| 5,105,067 | 4/1992 | Brekkestran et al. | 219/497 |
| 5,123,850 | 6/1992 | Elder et al. | 439/67 |
| 5,144,120 | 9/1992 | Krichever et al. | 235/472 |
| 5,158,039 | 10/1992 | Clark | 119/712 |
| 5,170,326 | 12/1992 | Meny et al. | 361/749 |
| 5,181,181 | 1/1993 | Glynn | 702/141 |
| 5,208,449 | 5/1993 | Eastman et al. | 235/462 |
| 5,220,488 | 6/1993 | Denes | 361/749 |
| 5,267,181 | 11/1993 | George | 364/709.12 |
| 5,272,324 | 12/1993 | Blevins | 235/462 |
| 5,278,730 | 1/1994 | Kikinis | 361/686 |
| 5,285,398 | 2/1994 | Janik | 364/708.1 |
| 5,289,345 | 2/1994 | Corradetti et al. | 361/752 |
| 5,305,181 | 4/1994 | Schultz | 361/680 |
| 5,305,244 | 4/1994 | Newman et al. | 364/708.1 |
| 5,306,162 | 4/1994 | Armendariz | 439/67 |
| 5,311,402 | 5/1994 | Kobayashi et al. | 361/760 |
| 5,319,526 | 6/1994 | Takashima | 361/788 |
| 5,329,106 | 7/1994 | Hone et al. | 235/472 |
| 5,349,500 | 9/1994 | Casson et al. | 361/749 |
| 5,363,275 | 11/1994 | Frankeny et al. | 361/749 |
| 5,373,421 | 12/1994 | Detsikas et al. | 361/788 |
| 5,402,077 | 3/1995 | Agahdel et al. | 324/758 |
| 5,416,310 | 5/1995 | Little | 235/462 |
| 5,422,514 | 6/1995 | Griswold et al. | 257/679 |
| 5,548,481 | 8/1996 | Salisbury et al. | 361/709 |
| 5,581,492 | 12/1996 | Janik | 364/708.1 |
| 5,620,782 | 4/1997 | Davis et al. | 428/209 |
| 5,692,911 | 12/1997 | Webster et al. | 439/67 |
| 5,798,907 | 8/1998 | Janik | 361/683 |
| 5,810,607 | 9/1998 | Shih et al. | 439/91 |

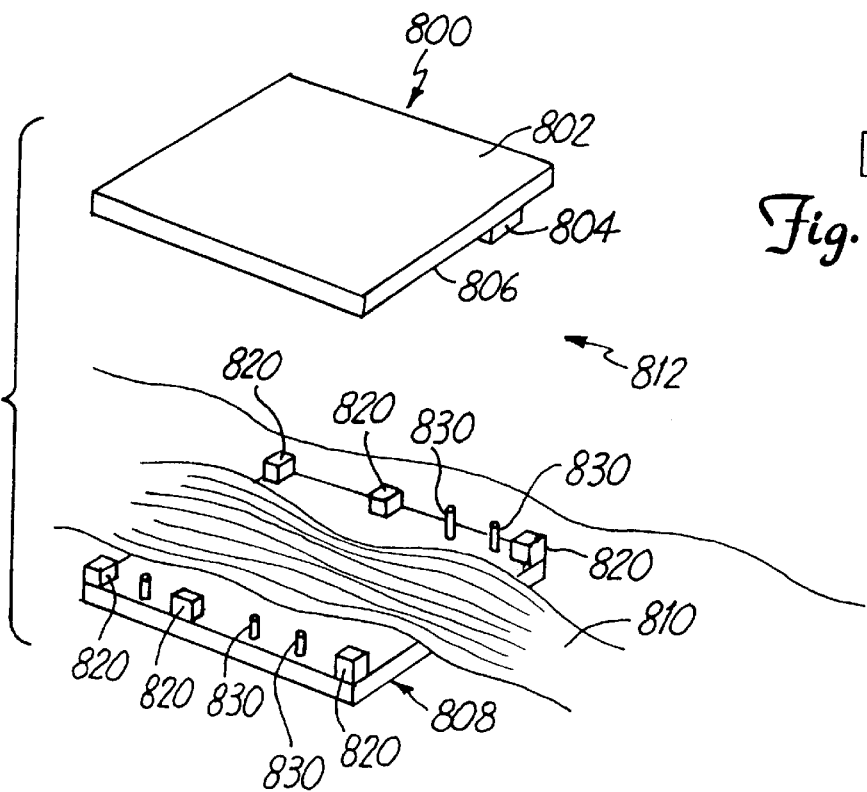
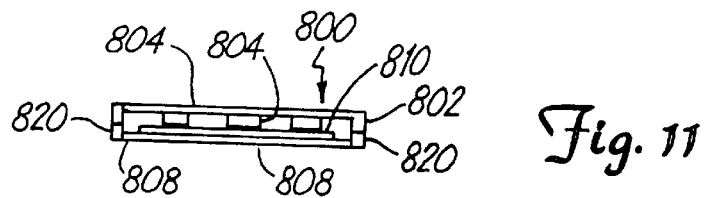
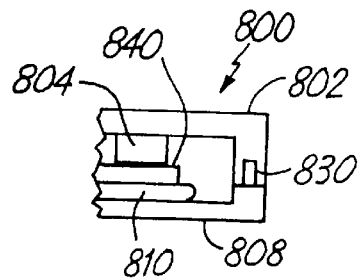

FLEXIBLE COMPUTER SYSTEM

CROSS-REFERENCE TO RELATED APPLICATION

The subject matter of this application is related to the subject matter of commonly assigned U.S. patent application Ser. No. 60/030,177, filed Nov. 1, 1996, which is incorporated by reference herein and priority to which is claimed under 35 U.S.C. §119(e).

BACKGROUND OF THE INVENTION

1. Field of the Invention

The invention relates to personal computer systems, for example those designed to be worn by a human user, and more particularly, to features of such systems that optimize comfort, miniaturization, processing speed, durability, reliability and/or ease of manufacture.

2. Description of Related Art

Wearable computing devices of many different types are being used in a host of commercial, industrial and consumer environments. Many such computers are brick-like, however, concentrating a great deal of weight in a bulky, cumbersome box that must be strapped onto the body.

The best wearable computers are lightweight and flexible, demonstrating superior ergonomics and allowing use during all normal activities. According to one example, flexible circuitry or equivalent flexible transmission devices join physically independent computer modules, allowing comfortable distribution of the computer about the body to accommodate a wide variety of body morphologies. Standard-interconnect input/output devices allow easy user upgrades and modular replacements. Spread-spectrum wireless Local Area Networks allow interaction with other users and/or with a host computer system. Flexible wearable computing devices are comfortable, easy-to-use, convenient and powerful alternatives to the brick-like machines that until recently have been the only choice in the marketplace.

Commonly assigned U.S. Pat. Nos. 5,285,398, 5,491,651 and 5,581,492 to Janik, and commonly assigned U.S. Pat. Nos. 5,555,490 and 5,572,401 to Carroll, all of which are incorporated by reference herein, disclose a number of extremely advantageous designs that are expected to dominate over previous, box-like wearable computers.

Recently, multi-chip module, thin-film circuit, and known-good-die technologies have allowed considerable miniaturization and standardization in personal computers. U.S. Pat. No. 5,422,514 to Griswold, for example, which is incorporated herein by reference, discloses a number of advantageous packaging structures and techniques. Griswold discloses a multi-chip module packaging structure having a thin-film decal interconnect circuit fabricated on a thin wafer of aluminum or other material. MicroModule Systems, Inc. has developed and produced a number of different multi-chip module and associated packaging products. Additionally, International Patent Applications Nos. WO 96/07143, WO 96/07921, and WO 96/07924 are incorporated herein by reference as well. Combining known-good-die and die-on-board technologies has yielded packaging structures with significant reliability and standardization advantages.

Given the many opportunities that have arisen with the introduction of these technologies, it would be very advantageous to develop and specifically adapt these technologies in wearable-computing environments. Additionally, it would be very advantageous to develop connector devices, packaging arrangements, and module-replacement technologies that can withstand the rigorous wearable-computing environment.

SUMMARY OF THE INVENTION

To overcome the problems associated with prior devices and to achieve various advantages, a number of computing systems and modules are described.

In one embodiment, a computing-device embodiment of the present invention comprises an upper casing, at least one integrated chip module electrically mounted on an interior side of the upper casing, a lower casing selectively engageable with the upper casing, and flexible circuitry extending through the upper casing and the lower casing, and being electrically connected to the at least one chip module within the lower and upper casing.

According to different embodiments of the invention, a unit casing is provided with specialized attachment and/or connection mechanisms for providing secure physical and/or electrical connections to the chip modules and associated circuitry. Further, the casing can act as a heat sink to actively aid in appropriate management of thermal radiation.

According to other embodiments, two circuitry-supporting substrates are provided back-to-back to form an interior of a computing module, and an exterior case is disposed around the internal substrates. Standoffs and/or protective encapsulant or gel are used to secure and protect the substrates within the case.

Embodiments of the invention are well-suited to BGA and other packing technologies and provide fast, small, durable, and cost-effective design configurations that represent significant improvements over prior-art wearable computers. Other features of the invention are described below.

BRIEF DESCRIPTION OF THE DRAWINGS

Embodiments of the invention will be described with reference to the figures, in which like reference numerals denote like elements and in which:

FIG. 10 is an exploded perspective view showing another embodiment of the present invention, for producing a secure connection to flexible circuitry;

FIG. 10A is a plan view of a module and frame arrangement according to an embodiment of the invention;

FIG. 11 is a cross-sectional view of the embodiment of FIG. 10;

FIG. 12 is an enlarged view of the embodiment of FIG. 11;

DETAILED DESCRIPTION OF PREFERRED EMBODIMENTS

Embodiments of the invention have wide application to a number of different computing technologies and environments. As discussed above, flexible wearable computers are gaining rapid acceptance in the marketplace in different computing environments, including military, maintenance, law enforcement, medical and other environments. Further, miniaturization and ease of manufacture are important in virtually all computing environments, not just those well-suited for wearable computers. Thus, although particular embodiments of the invention will be discussed with respect to wearable computers and in particular flexible wearable computers, the invention is not necessarily limited to those embodiments.

Figure 1:
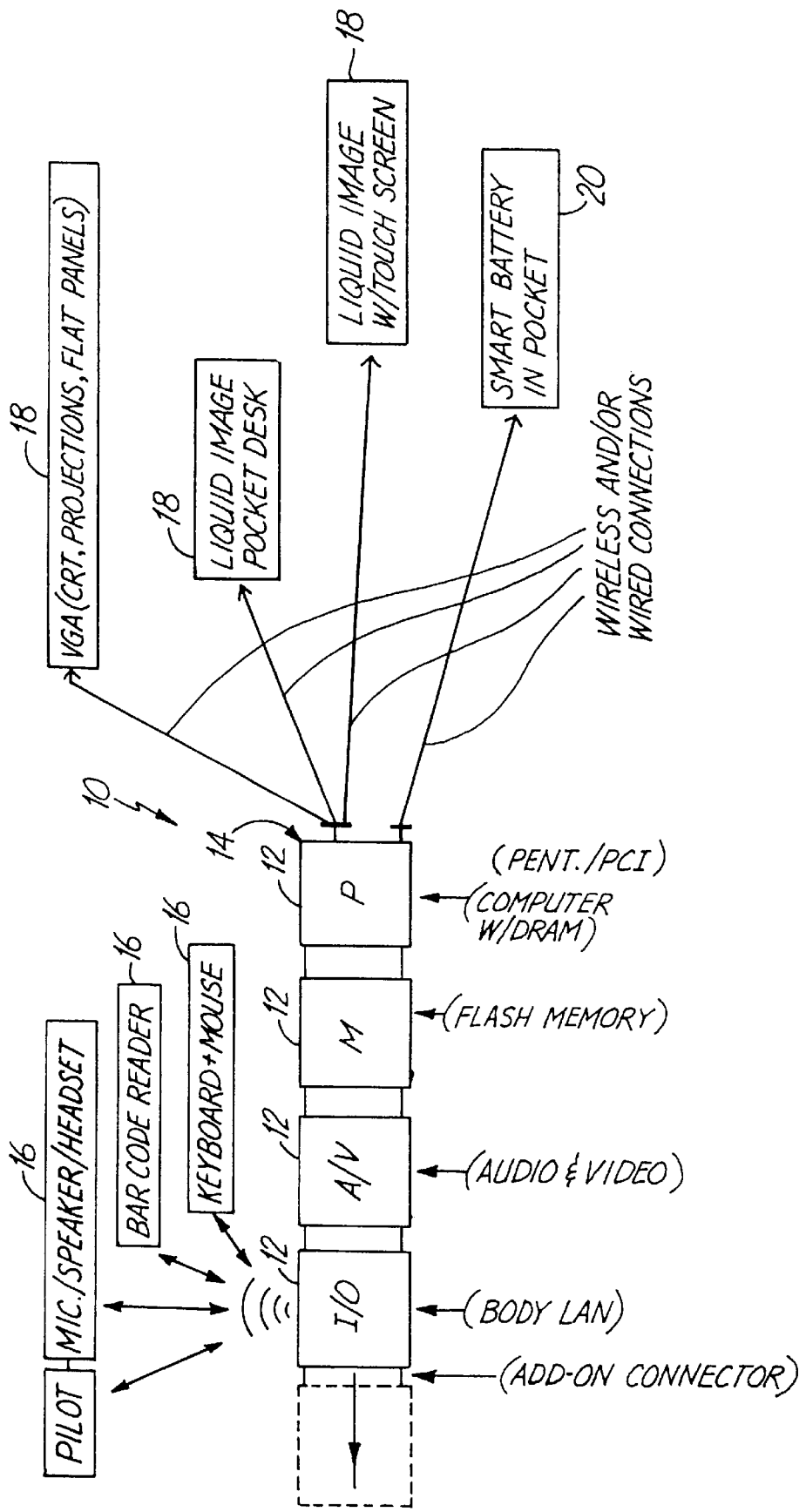
FIG. 1 is a schematic illustration of a flexible wearable computer system incorporating a computer module according to embodiments of the present invention.

Accordingly, FIG. 1 illustrates a flexible, wearable computer system 10 including an integrated set 14 of computing modules 12 (e.g. body LAN, audio & video, flash memory, etc.). Modules 12 function in association with input and output devices 16 (e.g. keyboard, bar code reader, mouse, microphone, etc.), display devices 18 (e.g. VGA monitors, liquid image displays), and battery 20 via wired and/or wireless connections.

Figure 2:
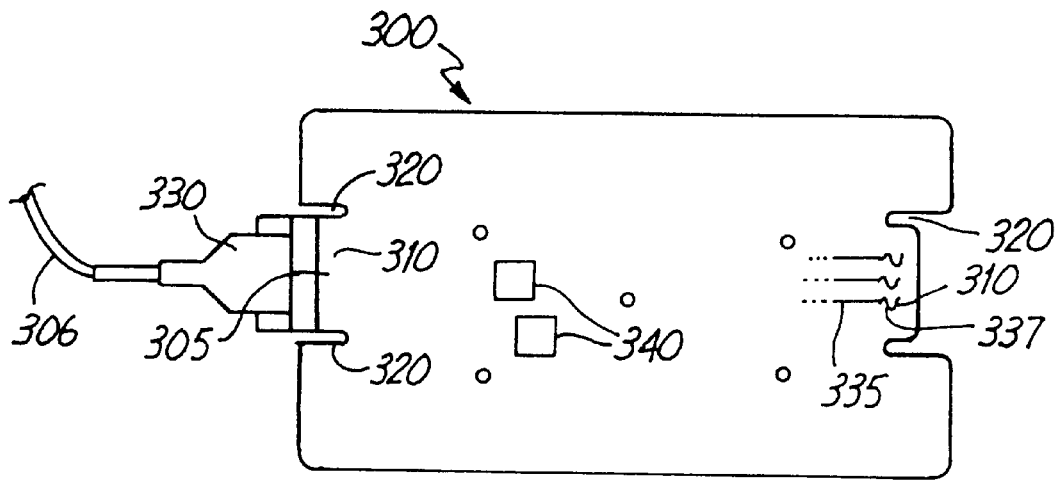
FIGS. 2–3 are side views of computer module case portions with connector elements, according to embodiments of the invention.
Figure 3:
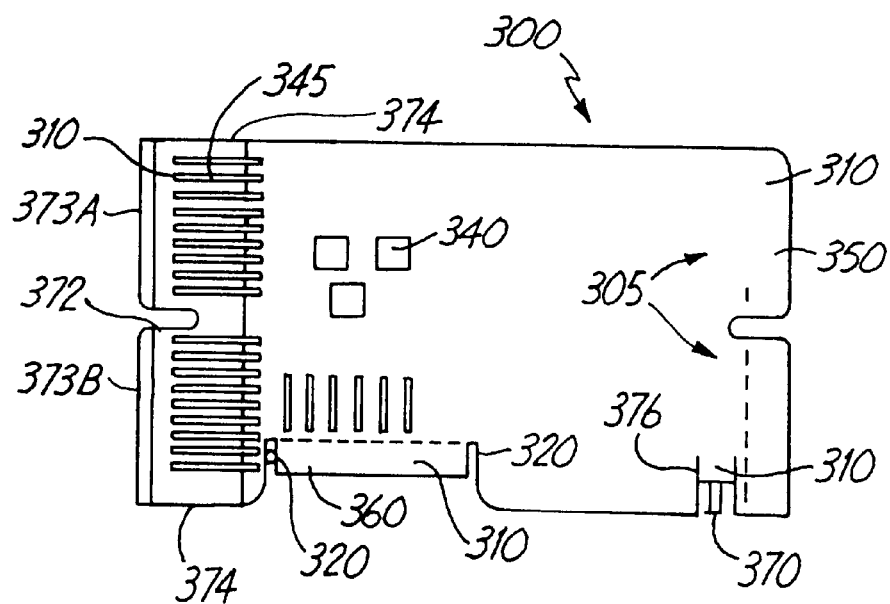

FIGS. 2–3 illustrate examples of modules 12 and an example of the manner of connection of modules to another module or an external peripheral device. Computing-module case 300 includes broken-away portions to show certain internal features. Module portions 300 include connection port(s) 305 with tabs 310, e.g. bordered by corresponding notches 320, for receiving connectors 330 (e.g. ribbon cable connectors, PC-card connectors, or other type of connector) useable with a portable or other computing device. Illustrated connector 330 (FIG. 2) extends from cable 306 of a peripheral device or other computing device (not shown).

Recessed connection port 305 with notches 320 (FIG. 2) enables computing module 300 to compensate for the tendency of cable 306 and/or connector 330 to pull sideways or at a sharp angle relative to module 300. Recessed and notched port 305 is important, because a significant factor weighing against the durability of any wearable computer device or other portable electronic device is connector strain. Embodiments of the invention enhance a robust connection, by including e.g. a recessed connection port to prevent cable connector 330 from forming a sharp angle relative to module 300, notches 320 and flexible tab 310, which permit flexing of connection port 305 with movement of connector 300.

Tabs 310 are constructed to flex with respect to the remainder of module case portion 300, for example by etching away the aluminum or other base material to leave a thin, flexible remainder. Traces and/or other signal-conducting elements 335, optionally including S-curved portions 337, are loosely mounted on but not bonded to tab 310 of case portion 300, according to one embodiment. Traces 335 connect to circuit elements 340, which can include die-on-board devices, multi-chip modules, discrete elements, etc. supported on case portion 300 at its central portion over etched and filled traces of suitable connection circuitry.

By leaving traces 335 loose on tab 310, tab 310 can "give" or bend slightly, if e.g. connector 330 is attached to it with undue or excessive force, without breaking the traces or subjecting them to unacceptable stress. S-curves 337 or other slack can be incorporated into traces 335 to better accommodate this bending movement. This represents a significant advantage over prior art devices, which are subject to significant trace damage if a connector is "jammed" into place.

Alternatively, tabs 310 can be made rigid with the remainder of case portion 300, and the associated traces and/or other signal-conducting elements bonded directly to tab 310. Directly bonding the circuitry ensures the substantially absolute planarity that is often desirable during etching and depositing operations, for example.

As shown in FIG. 3, tabs 310 can be associated with PC-card or other connector(s) 350, docking connector(s) 360 for docking to e.g. a desktop computer, and/or battery and power connector(s) 370. Docking station/connector 360 can provide input/output for CRT's, LCD's, sound, keyboard, mouse, etc., or can provide connection to a separate computer, as will be described. Further, docking connector 360, as well as the other connectors, are optionally recessed within the remainder of substrate 300 for protection. Of course, a wide variety of connectors can be used, and individual connectors can be designed to receive multiple connecting devices, for example both PC cards and a battery.

In particular, module 300 in FIG. 3 includes a single slot 372 between two connection ports 373A, 373B to permit flexing in a manner similar to the tab configuration in FIG. 2. However, in FIG. 3, the unrestricted edges 374 of module 300 effectively act as another slot permitting flexing of each connection port 373A, 373B. Moreover, tab 360 preferably is recessed even further than tab 310 ( in FIG. 2) and also includes notches on its sides. Connector 370 provides a similar protective arrangement for a power supply connection, only having a deeper recess and slits 376 instead of notches 320 to achieve the desired flexibility. In an alternative arrangement, the FIG. 3 embodiment also includes tabs 310 covered by a non-conductive material 345.

Instead of using a separate desktop computer to which a user's wearable computer is docked upon his or her arrival, the user's work environment can include merely a set of peripherals. Upon arrival at the work environment, the user can easily connect the wearable computer to various peripheral connectors there, for example display, keyboard, mouse and/or power connectors. Eliminating the desktop computer and using the wearable computer in its place is extremely advantageous, reducing hardware costs and freeing up desk space, for example. According to a one embodiment, the wearable computer itself is mountable directly onto one of the work environment devices, for example by VELCRO to a display device.

Figure 4:
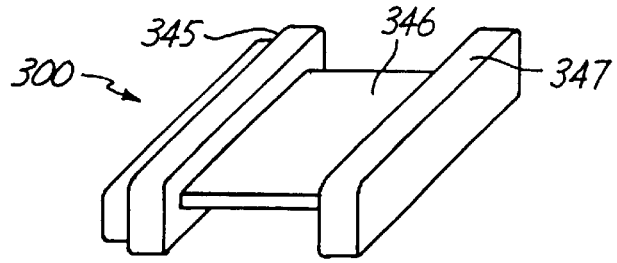
FIG. 4 is a perspective view showing a connector portion according to an embodiment of the invention.

According to another embodiment, a connector is recessed within case portion 300, the aluminum or other material out of which case 300 is formed being disposed over the connector to protect it. The strength of the aluminum supports the relatively weaker connector portion or exposed element associated with it, for example an emerging wire. If a thick enough slab of material is used as the case, the connector can be fully shrouded for enhanced protection. The shroud can simply be stamped onto the same metallic material onto which the device is being built, FIG. 4 illustrates an alternative connector design, in which case portion 300 is connected at ribbon cable connector 345 to at least one ribbon cable 346. Cable 346 is connected in turn to PC-card connector 347 or other type connector, for example a connector of an adjacent computing module.

Figure 5:
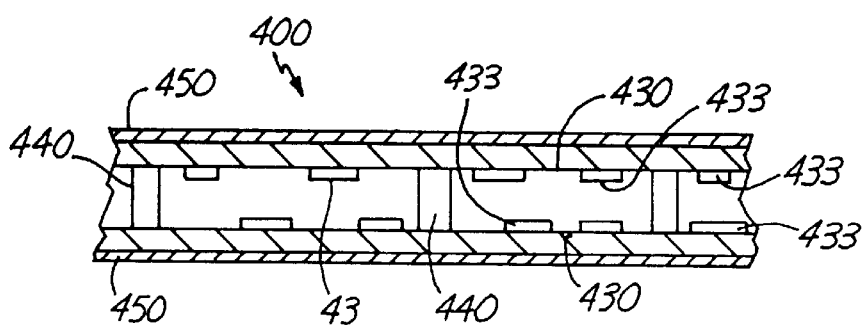
FIGS. 5–6 are partial cross-sectional views of computing modules according to embodiments of the invention.
Figure 6:
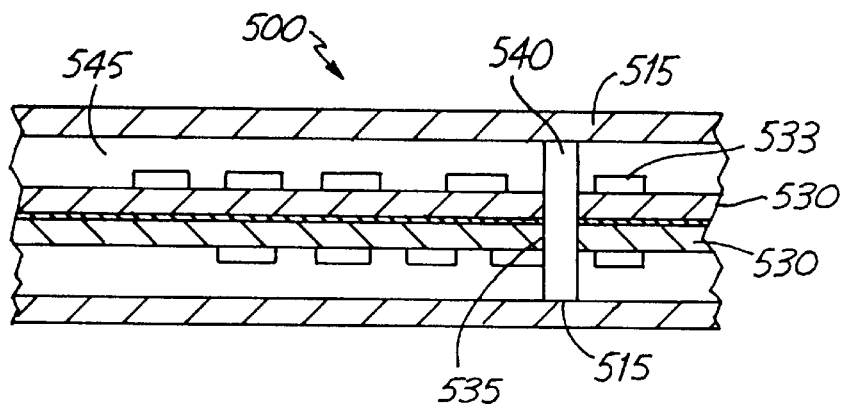

FIGS. 5–6 are partial cross-sectional views of internal computing module features according to embodiments of the invention. Module 400 comprises two external substrates 430, formed of e.g. aluminum. Substrates 430 have associated circuitry 433 fabricated/bonded thereon. A plurality of standoffs 440 separate substrates 430, to protect circuitry 433 and any other enclosed componentry from side-to-side squeeze pressure on module 400. Standoffs 440 are preferably formed of metal, rubber, TEFLON, or other materials, and can be arrayed in a desired pattern. According to one embodiment, standoffs 440 also act as connectors (e.g. elastomeric connectors) between circuitry 433 of upper and lower substrates 430, either by being formed of a conductive material or by having internal traces, for example.

The FIG. 5 embodiment also includes an optional bounce-resistant or other protective coating 450, disposed directly on substrates 430, to further protect circuitry 433. Of course, coating 450 can be disposed on the modules of the other embodiments disclosed herein as well.

Moreover, in FIG. 5, the substrate 430 can form the casing of the computing module (e.g. a module like module 12) and has electrically connected thereon circuitry 433 so that the substrate casing wall 430 effectively functions as a printed wire board. This arrangement of the casing forming the chip board is particularly advantageous with continued miniaturization, e.g. wherein the circuitry ultimately will comprise an entire computer itself. Accordingly, circuitry 433 can comprise several multi-chip or other packaging modules forming part or all of a computer housed within substrate casing 430.

According to the FIG. 6 embodiment, module 500 includes two internal substrates 530 that are formed of e.g. aluminum and that support circuitry 533. Substrates 530 are disposed back-to-back within external case 515, with circuitry 533 facing outwardly relative to the substrates. Case 515 can be formed of a rigid protective material, a flexible lithium-ion battery as discussed above, or other suitable materials/devices.

Aligned apertures 535 extend through back-to-back substrates 530 to receive standoffs 540. Standoffs 540, composed of metal, rubber, TEFLON, or other materials, can be rigidly attached to external case 515 so as to center or otherwise hold substrates 530 in position within module 500. Alternatively, standoffs 540 can "float" with respect to case 515 and merely fix the relative positions of substrates 530. In either case, standoffs 540 protect circuitry 533 and any other enclosed componentry from side-to-side squeeze pressure on module 500, and can be formed/arrayed as described with respect to the previous embodiment. Also as with the previous embodiment, standoffs 540 optionally act as connectors (e.g. elastomeric connectors) between circuitry 533 of upper and lower substrates 530, or between circuitry 533 and case 515.

Optionally disposed within the space between circuitry 533 and case 515 is protective material 545. Material 545 can include an elastomer material, foam, encapsulant, or other shock-absorbing or dampening material, to further protect circuitry 533 from outside forces.

Thus, as shown in FIGS. 5 and/or 6, the surface where the ASIC is mounted, e.g. surface 515, becomes the case of the processing device. It is a combination mounting area for the ASIC, as in the board of a BGA, whether it is aluminum or some other surface that the ASIC is mounted on. And it becomes the case of the processing device itself. Multi-chip modules with multiple ASIC's can be are mounted on a single backplate that is mounted as a single chip device, according to embodiments of the invention. As these are laid out on e.g. a single board backplane, and as multi-chip modules get large enough to be an entire computer, and as they are face-to-face in order to allow the backside of any device mounting means, like an ASIC against aluminum, to become the case for the computer, compactness is greatly increased. At the same time, however, the surfaces are prevented from being smashed together by the separation/elastomeric means, which also form a conductor between the two surfaces.

Figure 7:
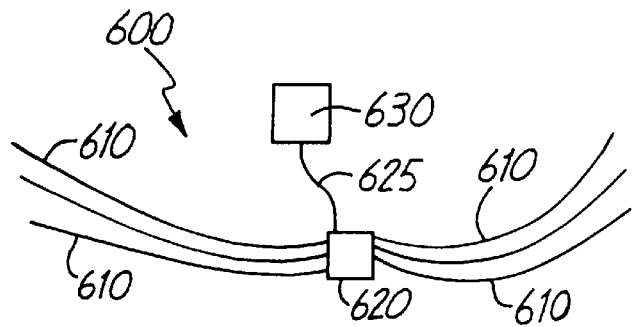
FIGS. 7–8 are schematic and perspective views, respectively, of a battery and/or computing-module system according to an embodiment of the invention.
Figure 8:
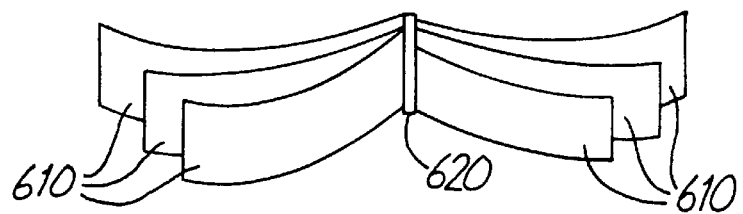

FIGS. 7–8 are top and perspective views of a flexible, wearable-computing and/or battery system 600 having multiple battery sections or computing modules arranged in layers and usable with wearable computers according to the invention.

A central connector 620 electrically interconnects the multiple battery and/or computing-module layers 610. This configuration can be used for either battery design or processing design, and can include combinations of both batteries and modules in a layered arrangement. In other words, a single module layer can include only one of a battery or a computing module, or a single module layer can include a battery on one side of the layer and a computing module on the other side of the same layer. This flexible, multilayer design permits central connector 620 to be conveniently disposed in the middle of the back of a human wearer, for example, to permit the multiple layers to extend and gently curve about the wearer's body in a non-binding fashion not obtainable in ordinary belt, linear flexible-wearable or other computer-module arrangements.

In other words, system 600 includes a plurality of flexible battery or computer segments 610 connected to a central member 620. This layered design is particularly advantageous in wearable-computing environments, in which body morphology should be well-accommodated to provide the greatest degree of physical comfort. Each segment 610, which advantageously can comprise an individual battery cell or individual computing module, can move independently, minimizing compression, stretch or other stress upon the overall system 600 as it is required to bend.

In a battery embodiment, connector 620 is connected by e.g. wire 625 to power supply 630. Power supply 630 includes a power supply transformer and logic, providing a direct and clean interconnect to the remainder of the computing device with minimal adverse emissions/noise. The power supply preferably is sold with member 620 and cells 610 to form an integrated battery system unit.

Battery system 600 can be selected to supply a desired voltage level for a particular computing application, e.g. 12 volts, 5 volts, 3 volts, or mere back-light voltage. Battery system 600 is connected to the computing module(s) of the wearable computing system by any desired means. Of course, as mentioned above, the same configuration can be used to implement a layered system of computing modules with or without a system of layered batteries.

Figure 9:
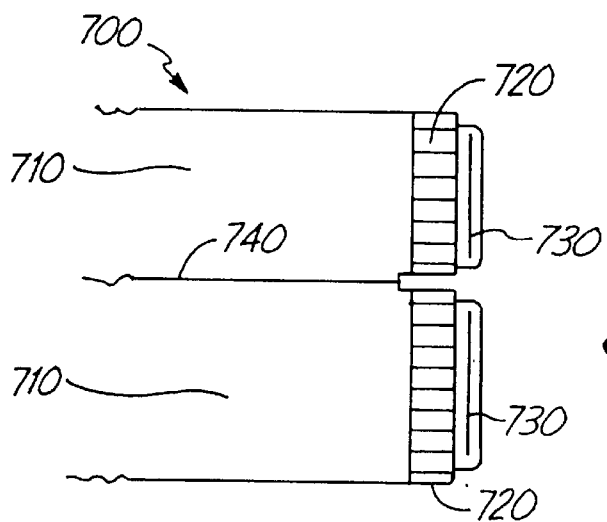
FIG. 9 is a side view of a hinged computing module according to an embodiment of the invention.

Computing-module embodiment 700 of FIG. 9 includes two substantially identical halves 710, each including PC-card or other connectors 720 for receiving respective PC cards or other e.g. modular connection devices 730. Individual halves 710 are connected by hinge portion 740, which preferably is formed by etching away the base material (e.g. aluminum) to a minimal thickness, for example, or by an alternative process. The PC cards or other connection devices are individually routed within module 700, but interconnects between halves 710 are run in connection with hinge 740.

FIG. 9 illustrates a single computing sheet having a small enough thickness for sufficient flexibility to bend around or otherwise accommodate the body. The two portions connect at one edge, fold over and function as one folded piece. The singularity of the module permits curving about the body yet does not bind against the wearer of the module because the two portions act as a single unit due to their connection along one edge. Electrical connections can be formed between portions 710 along entire edge 740 in the fold, allowing circuits to be placed on in essence four sides when it is folded over. A "butterfly" configuration as in FIGS. 7–8 is also contemplated. Thus, a narrow belt configuration can be produced, having enough space for connection wires. Module 700 can be formed as a single circuit or motherboard without a separate interconnection at fold 740. Thus, an entire motherboard can be built as one sheet and folded in half to be positioned on the body in a comfortable fashion and/or in a relatively compact space.

As an alternative to the FIG. 9 embodiment, a notch or connector can interface with the far end of the PC-card or other connector slot, so that a flexible interconnection is formed that can be folded over such that one end can be tucked into the other. In a battery-as-case embodiment, interconnects join the battery/case to the circuitry on the substrate.

A flexible wearable computer system according to embodiments of the invention is readily modularizable, allowing a variety of possible configurations, as shown in FIG. 1. Assuming sufficient miniaturization of the various connectors, for example, the wearable computing system can be radially constructed. A plurality of radially spaced connectors can be used, for example eight, and various input/output devices interchangeably affixed to any one of the connectors. The main portion of the computing shoulder ho then be worn around the left armpit in a shoulder holster, with one or more PC-card connectors and PC cards extending downwardly along the wearer's side. A battery runs from the most appropriately placed radial to come around to the right armpit for supporting the batteries. This dual shoulder holster arrangement provides an ample power supply and advantageously distributes and supports the weight of the system around the wearer's body.

A wide variety of thermal management arrangements are possible according to embodiments of the invention. For example, heat-distributive material can be disposed within one or more of the disclosed computing modules in various shapes or patterns, to route heat most effectively. Mounted in an "X" pattern, for example, the heat distributive material distributes heat from a central, thermally active portion outwardly to cooler distal portions. Heat-distributive material can also be disposed outside the case in various patterns, e.g. butterfly or "X" patterns, within an outer flexible shell. As the user leans back against a supporting surface, e.g. the back of a chair, the heat-distributive material redistributes within the shell to more effectively mix together and thus transfer heat from the module. Thus, thermal energy transfer is enhanced and facilitated.

According to preferred embodiments, dimensions of a wearable computing module using the technologies described above are significantly reduced. Modules according to the invention can be as small as or smaller than 2½ by 2 by ⅜ inches, readily accommodating e.g. 2⅛ inch PC-card or other connector widths.

FIG. 10 illustrates computing device unit 800 comprising upper casing 802, at least one integrated chip module 804 electrically mounted on interior side 806 of upper casing 802, lower casing 808 selectively engageable with upper casing 802, and flexible circuitry ribbon 810 extending through the upper casing 802 and the lower casing 808. Flexible circuitry ribbon 810 is electrically connected to chip 804 within a sealed frame 812 defined by upper and lower casings 802 and 808.

FIG. 11 illustrates computing module 800 in an assembled view. As shown, due to compression (further described below) between upper casing 802 and lower casing 808, chip module(s) 804 is/are in electrical connection with flexible circuitry ribbon 810 without any intermediate connector to provide a thin, robust computing module ideal for a flexible wearable computer system.

Integrated chip module 804 can be a MMS-type processor module, or of other types including MCM, MCP, BGA, and microBGA. The computing module configuration of FIG. 10 can implemented as any of modules 12 (e.g. body LAN, audio, video, flash memory, global positioning, CMOS digital camera, body sensors, radar sensors) shown in FIG. 1, for example.

Module 800 further includes protection frame 820 including an electromagnetic interference capability and arrangement to effect a seal for frame 812. A sealing cap is configured and arranged in one or several portions 820 to protect electrical circuitry and align the electrical components as well as the upper and lower casings 802 and 808. The protection frame can also function simultaneously as a elastomeric connector, and/or to be the electrical contact point for the module 800.

Frame 812 is provided with sufficient rigidity by having rivets 830, blind rivets, or other suitable connectors 830 in cooperation with protection frame elements 820 as necessary. A matching frame or frames with properly placed holes is lined up with the first frame, and the two (or more) are pressed together, simultaneously or sequentially, to form an assembly that is preferably a one-time press-together fitting.

As shown in FIG. 12, elastomeric connector 840 (see further examples in FIGS. 13 and 14) can be placed between flexible circuitry 810 and chip module 804 and be compressed appropriately, ensuring consistency and adequacy of electrical contact inside the frame/module. Elastomeric connector 840 thus can be called an elastomeric support or an elastomeric bed. Further as shown in e.g. FIG. 12, elastomeric bed 840, chip module 804, and circuitry 810 (which can be called a circuitry substrate), are arranged along a substantially straight line extending from upper casing 802 to lower casing 808 or vice versa. According to one example, the substantially straight line can be substantially perpendicular to casings 802, 808. To facilitate alignment and electrical connection, elastomeric connector 840 can be of many different shapes. For example, the elastomeric connector can be rectangular, elongate, and/or form a border about the module (e.g. for a tape automated ball grid array). Moreover, the elastomeric connector can form a portion of protection frame 820 to reduce the total amount of material for constructing module 800. With this and previously described embodiments, an elastomeric or other connector can be used, and it can have a number of wires or traces stuck into/through the connector and cut off at the end. At the end, then, precise alignment with e.g. the ball(s) of a BGA is not as much of a concern, as long as sufficient contact is made with a sufficient number of wires in the connector. Thus, solder-free connection of a BGA or other module with flexible circuitry or other signal-carrying component can be accomplished.

Protection frame 820 can be continuous (see FIG. 14, to be described,) or broken into portions (FIG. 10), and can extend around or pass through a portion of the flex circuitry. In addition, protection frame 820 can act in substitute of pins 830 and/or be formed in a combination of blocks that interlock for compression, alignment, and protection of the circuitry to provide a seal and EMI protection. In addition, when protection frame 820 is broken into portions, it can include portions that are formed as part of the chip module 804 to provide the balance of the protection frame 820. As shown in FIG. 10A, protection frame 820 can be attached, molded or otherwise formed as a ball grid array (BGA) chip package to form a border around a BGA package module 804. This concept can be applied throughout casing frame 812 to eliminate need for a separate protection frame.

Lower casing 802 acts with the upper casing 808 to ensure secure connection between flex circuitry 810 and BGA package 804, e.g. keeping the balls from slipping and aligning the entire unit assembly 812 to ensure electrical contact in the appropriate areas of flex circuit 810.

Figure 13:
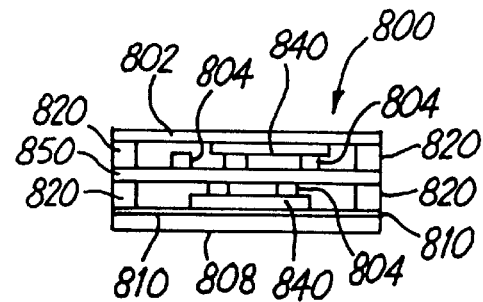
FIG. 13 is an alternative embodiment of the embodiment of FIGS. 10–11.
Figure 15:
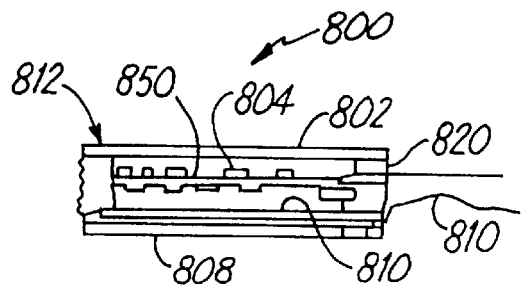
FIG. 15 is a cross-sectional view similar to FIG. 13.
Figure 16:
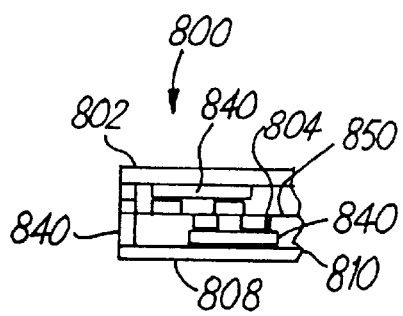
FIG. 16 is an enlarged view of a portion of FIG. 15.

FIG. 13 illustrates a stacked-configuration module 800 having a printed wire board 850 suspended between lower casing 808 and upper casing 802 with chip modules 804 on each side of board 850. Protection frame 820 seals frame 812 and separates the respective casings. In addition, an elastomeric connector 840 facilitates connection of chip modules 804 with flex circuitry ribbon 810. Embodiments of this configuration are shown in an exploded view in FIG. 14 and in FIGS. 15 and 16.

Figure 17:
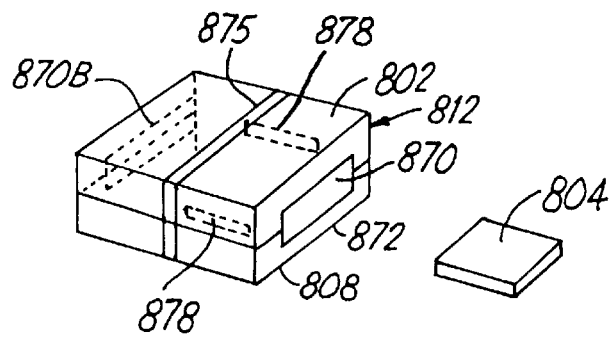
FIG. 17 is a perspective view of a slotted-module embodiment according to the invention.

In the embodiment shown in FIG. 17, chip module 804, e.g. a BGA module, MCM or other module, e.g. as described above, is also removably insertable into position and electrical connection against upper casing 802 and/or protection frame 820 and/or elastomeric connector 840. For example, upper casing 802 can be removed, chip module 804 removed and another chip installed in its place. This exchange can also be performed from a side of the unit through formed slot 870 which is adapted to receive a chip module inserted into the casing. Module 804 is then electrically secured against the casing and electrical connector (e.g. elastomeric connector) to the flexible circuitry by mechanical compression with an exterior clip 875 about the casing, a wedge action or other means to make the contact. Snap-fit, screwed-together, levered or other mechanical means to provide the compression are contemplated according to the invention.

Figure 18:
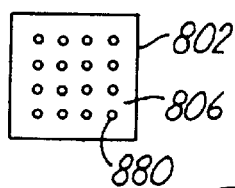
FIG. 18 is a plan view of a dimpled-surface arrangement according to an embodiment of the invention.

In this mechanism, the casing and/or protection frame includes alignment guides 878 to guide module 804 as it is slidably inserted into and through edge 872 of the casing unit. Once module 804 is guided within the protection frame, it drops into a reciprocating electrical connection pad. To secure the electrical contacts, an insertable wedge or other mechanism for applying exterior pressure to the casing is used (e.g a clip). To facilitate the placement and connection of the module to the upper casing 802, interior side 806 of the upper casing can include a dimpled area 880 (FIG. 18) for accommodating/reciprocating the ball arrays on a BGA module or the connection elements of another desired module.

In this configuration, to exchange a module, a technician opens the upper casing, causing the module to pop up preferably with some mechanical assistance. This permits the module to be removed from the casing unit. Next, the technician slides a replacement module into the casing from the edge slot 870 wherein the alignment guides 878 within the casing cause the module to slide downward to the reciprocating connection pad. The technician then selectively secures the upper casing to the lower casing to close the unit and thereby securely electrically connect the module between the upper casing and the flexible circuitry by compression of the upper and lower casing against the electrical components disposed therebetween.

Of course, as mentioned above, this connection can be made without solder due to the combination of automatic alignment and mechanical compression and can be further facilitated through the use of flexible elastomeric connectors placed at the point of electrical connection between the module and flexible circuitry or other intermediate surface of electrical connection.

The FIG. 17 embodiment can also include a pair of unit casing side slots 870B and is capable for selectively ejecting a single module 804 into and through first slot 870 of casing frame 812. Compression on the upper and lower casing 802, 808 is partially relieved so that upon insertion of a replacement module 804, the existing module is forced out of position of the unit casing and ejected from the casing through second slot 870B. The replacement module is guided into place and then compression (via clamp, snap-fit or the like) is again applied between the upper and lower casing 802, 808 of the unit to securely electrically connect the replacement module in place relative to flexible circuitry 810.

This arrangement permits selective replacement of e.g. a BGA chip module 802 while avoiding or at least minimizing handling of it. Excessive handling can contaminate the electrical contacts and cause short circuits or other damage/problems. According to embodiments of the invention, a user in the field can substitute different modules having different functions, as needed.

A chip 804 that is an MMS processor advantageously can be on an aluminum blank, or equivalent, as described above, preferably conductive of heat to the outside.

Figure 14:
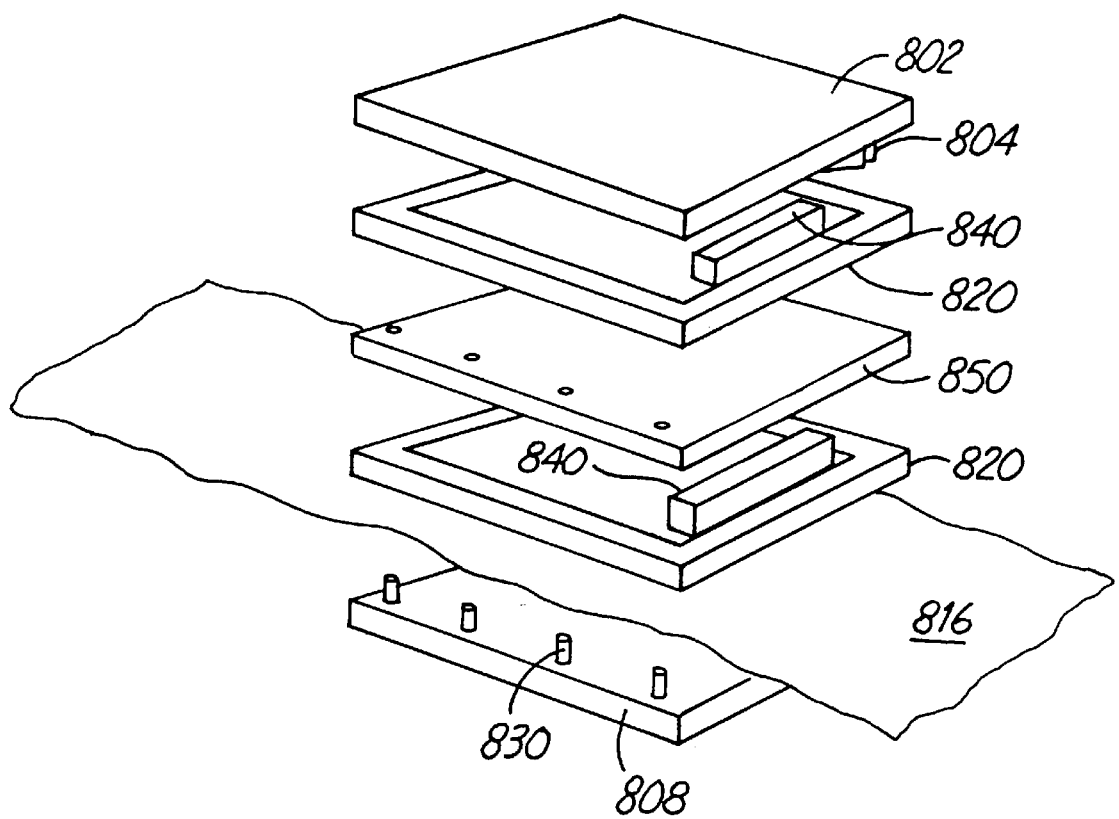
FIG. 14 is an exploded perspective view of the embodiment of FIG. 13.

Protection frame(s) 820 in e.g. FIG. 14 are placed between the pressed-together fittings to take up the space along the electronic parts to be suspended in the module on the boards. The frame(s) preferably are tolerant, allowing compression of the elastomeric connector(s), and seal the electronics from the outside world. They also preferably provide EMI continuity. More or less than the two illustrated protection frames can be provided, depending on the number of board layers provided.

Also in FIG. 14, elastomeric connector(s) 840 preferably extend from the flexible circuit, the flexible backplane, to the first of the boards. Additional connector(s) extend between additional boards, as needed. In the case where the MMS-type processor module 804 is used, as illustrated, the connector 840 preferably reaches the circuitry 810 bonded to the board 850. Backplate lower casing 808 preferably is a protective and restraining backplate that the fasteners connect to, protecting the flex circuit layer 810 and providing a support for the compressing of the elastomeric connector(s) and bonding.

Locator means, preferably the holes into which assembly means 830 (e.g. rivets, closure pins, compression pins, ratcheting inside-outside plastic- or nylon-type connectors with closely spaced and/or precisely spaced teeth on a post inserted going into an internally toothed shaft, etc.) are precisely placed, are provided. They can be bonded to one side and compressed on the other, according to one embodiment. One of their primary functions is to properly locate the illustrated components with respect to each other, so that the electronics of the various layers match up with each other through the stack. A series of preferably evenly spaced locator pins or other fasteners are located on both sides of the elastomeric connector(s) to prevent arching effect.

While the invention has been described with reference to specific embodiments, the description is illustrative and is not to be construed as limiting the scope of the invention. For example, features of the various disclosed embodiments can be mixed and matched to suit a particular application; e.g. the disclosed battery system can be used with any of the disclosed module embodiments. Additionally, the illustrated and described features can be used with not only wearable but other types of computing devices. Wireless or wired, infrared, optical, and other communication schemes are contemplated. Instead of flexible circuitry, ribbon or otherwise, additional signal-relaying componentry can be used in all embodiments of the invention. By "signal" is meant power signals, data signals, and other electrical, optical, IR, RF or other signals providing transmission and/or communication. Various other modifications and changes may occur to those skilled in the art without departing from the spirit and scope of the invention.

What is claimed is:

1. A computing device comprising:
an upper casing;
at least one integrated chip module electrically mounted on an interior side of the upper casing;
a lower casing selectively engageable with the upper casing;
flexible circuitry extending through the computing device beyond the upper casing and the lower casing, and being electrically connected to the at least one chip module; and
at least one electrical connector interposed between the integrated chip module and the flexible circuitry.

2. The computing device of claim 1, further comprising a protection frame disposed between the upper casing and the lower casing about at least a portion of an outer edge of the upper casing and lower casing, the protection frame being sized to maintain spacing between the interior of the upper casing and an interior of the lower casing.

3. The computing device of claim 2, wherein the protection frame is configured and arranged to selectively interlock the upper casing and the lower casing.

4. The computing device of claim 2, wherein the protection frame is an electrical connector.

5. The computing device of claim 1, further comprising a casing connector for releasably compressing the upper casing against the lower casing to securely connect the upper casing to the lower casing and to securely electrically connect the chip module to the flexible circuitry.

6. The computing device of claim 5, wherein the casing connector comprises a clamp releasably securable about the upper and lower casing.

7. The computing device of claim 5, wherein the casing connector comprises a combination of a plurality of recesses formed on the upper casing and a plurality of detents on the lower casing that reciprocate with the recesses of the upper casing to define at least one of a snap-fit connection and a frictional engagement connection.

8. The computing device of claim 1, wherein the chip is an area grid array chip.

9. The computing device of claim 8, wherein the chip is a ball grid array chip.

10. The computing device of claim 1, wherein the at least one electrical connector is constructed to protect the integrated chip module and the flexible circuitry ribbon.

11. The computing device of claim 1, wherein the at least one electrical connector is adjustably coupled to the upper casing.

12. The computing device of claim 1, wherein the lower casing and the flexible circuitry ribbon are affixed as a one-piece component.

13. The computing device of claim 1, wherein the lower casing further comprises an at least one alignment mechanism for connecting to the upper casing.

14. A system of computing devices according to claim 1, interconnected to form a computer system.

15. The computing device of claim 1, wherein the at least one electrical connector is an elastomeric connector.

16. The computing device of claim 15, wherein the elastomeric connector comprises a plurality of leads.

17. A computing device unit comprising:
an upper casing;
at least one integrated chip module electrically mounted on an interior side of the upper casing;
a lower casing selectively engageable with the upper casing;
a flexible circuitry ribbon extending through the unit between the upper casing and the lower casing, and being electrically connected to the at least one chip module within the lower and upper casing;
wherein the chip is a ball grid array chip; further wherein an electrical connector is interposed between, and electrically connects, the ball grid array chip and the flexible circuitry within the upper and lower casing.

18. The computing device unit of claim 17, wherein the connector is an elastomeric connector having a plurality of electrical leads extending therethrough for electrical connection to the ball grid array chip and to the flexible circuitry.

19. A computing device unit, comprising:
an upper casing;
a printed wire board including at least one integrated chip module electrically mounted thereon;
a lower casing removably selectively engageable with the upper casing;
a first protection frame interposed between and extending about a periphery of the upper casing and the printed wire board, and a second protection frame interposed between and extending about a periphery of the lower casing and the printed wire board;
a portion of a flexible circuitry ribbon extending through the unit between the second protection frame and the lower casing; and
at least one electrical connector interposed between and electrically connecting the portion of flexible circuitry and the chip of printed wire board;
wherein selective engagement of the upper casing to the lower casing secures the printed wire board, first and second protection frames, electrical connector, and the portion of flexible circuitry within the upper and lower casing and secures electrical connection between the flexible circuitry and the at least one chip.

20. A flexible computing device comprising a flexible computing module including a single computing circuit disposed on a single flexible sheet of flexible circuitry and including a first portion foldable over a second portion of the sheet, wherein the circuit extends contiguously between the first portion and the second portion free of a connector therebetween; further wherein the first portion is adapted for receiving a first modular connection device and the second portion is adapted for receiving a second modular connection device, the first and second modular connection devices being readily receivable in and removable from the first and second portions.

21. The flexible computing device of claim 20, wherein the first and second modular connection devices are each selected from the group consisting of a PC card and a micro card.

22. A computing unit, comprising:

a first outer casing portion;

a second outer casing portion fixedly supported with respect to the first outer casing portion;

an elastomeric bed supported between the first and second outer casing portions;

a chip module supported between the first and second outer casing portions; and circuitry substrate supported between the first and second outer casing portions and in electrical connection with the chip module;

wherein the elastomeric bed, chip module, and circuitry substrate are arranged along a substantially straight line extending from the first outer casing portion to the second outer casing portion, further wherein the chip module is positioned between the elastomeric bed and the circuitry substrate.

23. The computing unit of claim 22, wherein the elastomeric bed is in electrical connection with the chip module and the circuitry substrate.

24. The computing unit of claim 22, wherein the straight line is substantially perpendicular to the first and second outer casing portions.

25. The computing unit of claim 22, wherein the elastomeric bed is attached to one of the first and second outer casing portions.

26. The computing unit of claim 22, wherein the chip module is a first chip module and the computing unit comprises a second chip module, the first and second chip modules being attached to the elastomeric bed.

27. The computing unit of claim 26, wherein the elastomeric bed is attached to one of the first and second outer casing portions.

28. The computing unit of claim 22, wherein the elastomeric bed comprises an electrical conductor.

* * * * *

UNITED STATES PATENT AND TRADEMARK OFFICE
CERTIFICATE OF CORRECTION

PATENT NO. : 6,097,607
DATED : August 1, 2000
INVENTOR(S) : Carroll et al.

It is certified that error appears in the above-identified patent and that said Letters Patent is hereby corrected as shown below:

Column 7,
Lines 38-39, "shoulder ho" has been changed to -- device can --.

Signed and Sealed this

Twenty-fifth Day of December, 2001

*Attest:*

JAMES E. ROGAN
*Director of the United States Patent and Trademark Office*

*Attesting Officer*